US012676279B2

(12) United States Patent
Suzuki et al.

(10) Patent No.: US 12,676,279 B2
(45) Date of Patent: Jul. 7, 2026

(54) ELECTRON MICROSCOPE

(71) Applicant: Hitachi High-Tech Corporation, Tokyo (JP)

(72) Inventors: Michiko Suzuki, Tokyo (JP); Yudai Kubo, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 325 days.

(21) Appl. No.: 18/559,439

(22) PCT Filed: May 13, 2021

(86) PCT No.: PCT/JP2021/018214
§ 371 (c)(1),
(2) Date: Nov. 7, 2023

(87) PCT Pub. No.: WO2022/239187
PCT Pub. Date: Nov. 17, 2022

(65) Prior Publication Data
US 2024/0242923 A1    Jul. 18, 2024

(51) Int. Cl.
*H01J 37/153* (2006.01)
*H01J 37/143* (2006.01)
*H01J 37/28* (2006.01)

(52) U.S. Cl.
CPC .......... *H01J 37/153* (2013.01); *H01J 37/143* (2013.01); *H01J 37/28* (2013.01); *H01J 2237/1534* (2013.01)

(58) Field of Classification Search
CPC ........ H01J 37/152; H01J 37/26; H01J 37/143; H01J 2237/153; H01J 2237/1534; H01J 2237/2802
See application file for complete search history.

(56) References Cited

U.S. PATENT DOCUMENTS 4,962,313  A  *  10/1990  Rose ..................... H01J 37/153
                                                    250/311
6,605,810  B1    8/2003  Haider et al.
(Continued)

FOREIGN PATENT DOCUMENTS

JP      2002-510431  A      4/2002
JP      2010-170940  A      8/2010
JP      2012-234755  A     11/2012

OTHER PUBLICATIONS

International Search Report (PCT/ISA/210) issued in PCT Application No. PCT/JP2021/018214 dated Aug. 3, 2021 with English translation (4 pages).
(Continued)

*Primary Examiner* — Wyatt A Stoffa
(74) *Attorney, Agent, or Firm* — Crowell & Moring LLP

(57)        ABSTRACT

An object of the invention is to efficiently execute aberration correction in an electron microscope including an aberration corrector that corrects aberration using a multipole lens. The electron microscope according to the invention includes an aberration corrector that includes first and second multipole lenses, a transfer lens, and an adjustment lens, in which the first multipole lens is configured to correct third-order spherical aberration by adjusting a lens current, and third-order spherical aberration and fifth-order spherical aberration are collectively corrected by adjusting a transfer lens current while changing an adjustment lens current (refer to FIG. 6).

10 Claims, 9 Drawing Sheets

(56)                    References Cited

U.S. PATENT DOCUMENTS

| | | | | |
|---|---|---|---|---|
| 8,791,423 B2* | 7/2014 | Hirayama | ............... | H01J 37/26 |
| | | | | 250/311 |
| 2003/0029999 A1* | 2/2003 | Hosokawa | ............. | G01N 23/04 |
| | | | | 250/310 |
| 2003/0098415 A1* | 5/2003 | Matsuya | ............... | H01J 37/153 |
| | | | | 250/306 |
| 2007/0125945 A1* | 6/2007 | van der Zande | ..... | H01J 37/153 |
| | | | | 250/307 |
| 2009/0032709 A1* | 2/2009 | Sawada | ................... | H01J 37/26 |
| | | | | 250/311 |
| 2009/0039281 A1* | 2/2009 | Kawasaki | ............... | H01J 37/26 |
| | | | | 250/311 |
| 2009/0242786 A1* | 10/2009 | Yoshida | ................ | H01J 37/153 |
| | | | | 250/396 R |
| 2019/0304739 A1* | 10/2019 | Morishita | ............... | H01J 37/10 |
| 2021/0050179 A1* | 2/2021 | Uhlemann | ............ | H01J 37/153 |
| 2021/0159044 A1* | 5/2021 | Henstra | ................ | H01J 37/153 |
| 2024/0006148 A1* | 1/2024 | Tamaki | ............... | H01J 37/1471 |
| 2025/0336641 A1* | 10/2025 | Ishizawa | ................ | H01J 37/28 |

OTHER PUBLICATIONS

Japanese-language Written Opinion (PCT/ISA/237) issued in PCT Application No. PCT/JP2021/018214 dated Aug. 3, 2021 with English translation (5 pages).

\* cited by examiner

ELECTRON MICROSCOPE

TECHNICAL FIELD

The present invention relates to an electron microscope that observes a sample using an electron beam.

BACKGROUND ART

In an electron microscope such as transmission electron microscopy (TEM), scanning transmission electron microscopy (STEM), or scanning electron microscopy (SEM), as the diameter of an electron beam (probe) with which a sample is scanned decreases, a higher resolution can be obtained. The probe diameter is limited by aberration of an electron optical system. Recently, a device where an aberration corrector is mounted to correct the aberration was put into practice. When an aperture angle $\alpha$ is increased to increase a probe current, third-order spherical aberration among low-order aberrations is particularly predominant. When the aperture angle is further increased, high-order aberration such as fifth-order spherical aberration is predominant. The aperture angle $\alpha$ refers to an angle between an optical axis and an electron beam emitted from a light source at a maximum angle when the beam passes through a lens and is focused on a sample. The third-order spherical aberration is represented by $C_3\alpha^3$, and the fifth-order spherical aberration is represented by $C_5\alpha^5$. $C_3$ represents a third-order spherical aberration coefficient, and $C_5$ represents a fifth-order spherical aberration coefficient.

In general, positive third-order spherical aberration of an objective lens is corrected using negative third-order spherical aberration generated as a secondary effect of a hexapole lens. It is known that the fifth-order spherical aberration can be corrected by coupling the aberration corrector and the objective lens under an appropriate transfer condition. In general, the aberration corrector is configured by a plurality of multipole lenses, a plurality of transfer lenses, and an adjustment lens.

As a basic aberration correction method, PTL 1 describes a technique "The invention relates to an apparatus for correcting a third-order aperture aberration in a lens, particularly, in an objective lens of an electron microscope, the apparatus including: an objective lens; and a correction device that is well-known itself, in which the correction device includes two hexapoles and two spherical lenses having the same focal length that are disposed between the two hexapoles, and one spherical lens (3) is disposed between the objective lens (2) and the correction device (1) such that an optical path is incident on one side of the spherical lens (3) to be parallel to the correction device (1) and is focused on a plane (16) of the objective lens having no coma aberration on another side of the spherical lens (3), or two spherical lenses are disposed between the objective lens and the correction device such that a distance between the spherical lens (14) closer to the objective lens and the plane (16) of the objective lens having no coma aberration is equal to a focal length of the spherical lens and a distance between the two spherical lenses (14, 15) is equal to the sum of focal lengths of the two spherical lenses" (refer to ABSTRACT).

PTL 2 describes a configuration of an aberration corrector and a third-order parasitic aberration correction method. PTL 2 describes an object "to provide a charged particle beam apparatus capable of independently correcting third-order star aberration of two-fold symmetry (S3) and third-order astigmatism of four-fold symmetry (A3) that are secondarily generated by including a spherical aberration corrector" and describes a technique "a charged particle beam apparatus including a spherical aberration correction device that includes first and second multipole lenses 9 and 13 and transfer lenses 10 and 12 disposed between the first and second multipole lenses 9 and 13, in which first deflection means 8 and second deflection means 11 are controlled such that an inclination angle $\theta 2$ of a charged particle beam 31 incident on the second multipole lens 13 with respect to an optical axis 1 changes in conjunction with an inclination angle $\theta 1$ of the charged particle beam 31 incident on the first multipole lens 9 with respect to the optical axis 1" (refer to ABSTRACT).

PTL 3 describes an object "to provide a scanning transmission electron microscope and an aberration correction method having a function of correcting fifth-order spherical aberration $C_5$ simply with high accuracy" and describes a technique "a scanning transmission electron microscope including: an electron optical system; a spherical aberration corrector that is disposed between a convergence lens and an objective lens of the electron optical system and includes a plurality of multipole lenses for generating a hexapole field to compensate for a spherical aberration of the objective lens; at least one adjustment lens that is disposed between the spherical aberration corrector and the objective lens; Ronchigram detecting means for observing a Ronchigram of a sample; and an information processing device, in which the information processing device changes a focal length of the adjustment lens to detect the Ronchigram of the sample, detects a change of a hexagonal pattern appearing in the Ronchigram along with the change of the focal length, and determines a correction condition of fifth-order spherical aberration $C_5$" (refer to ABSTRACT).

CITATION LIST

Patent Literature

PTL 1: JP2002-510431A
PTL 2: JP2012-234755A
PTL 3: JP2010-170940A

SUMMARY OF INVENTION

Technical Problem

In the current aberration corrector, when an acceleration voltage is changed, third-order spherical aberration and fifth-order spherical aberration cannot be simultaneously corrected unless the amount of excitation of a multipole lens is largely changed. Accordingly, a magnetic field removal process or a change over time in aberration occurs, and a wait time is taken until the apparatus can be stably used. The magnetic field removal (degaussing) process typically takes about 20 seconds and needs to be executed multiple times to adjust the aberration corrector. Therefore, a long period of time is required.

The invention was made in consideration of the above-described problems, and an object thereof is to efficiently execute aberration correction in an electron microscope including an aberration corrector that corrects aberration using a multipole lens.

Solution to Problem

An electron microscope according to the invention includes an aberration corrector that includes first and second multipole lenses, a transfer lens, and an adjustment lens, in which the first multipole lens is configured to correct third-order spherical aberration by adjusting a lens current, and third-order spherical aberration and fifth-order spherical aberration are collectively corrected by adjusting a transfer lens current while changing an adjustment lens current.

Advantageous Effects of Invention

The electron microscope according to the invention can efficiently execute aberration correction by collectively correcting third-order spherical aberration and fifth-order spherical aberration using an adjustment lens and a transfer lens in combination.

DESCRIPTION OF EMBODIMENTS

First Embodiment: Device Configuration

Figure 1:
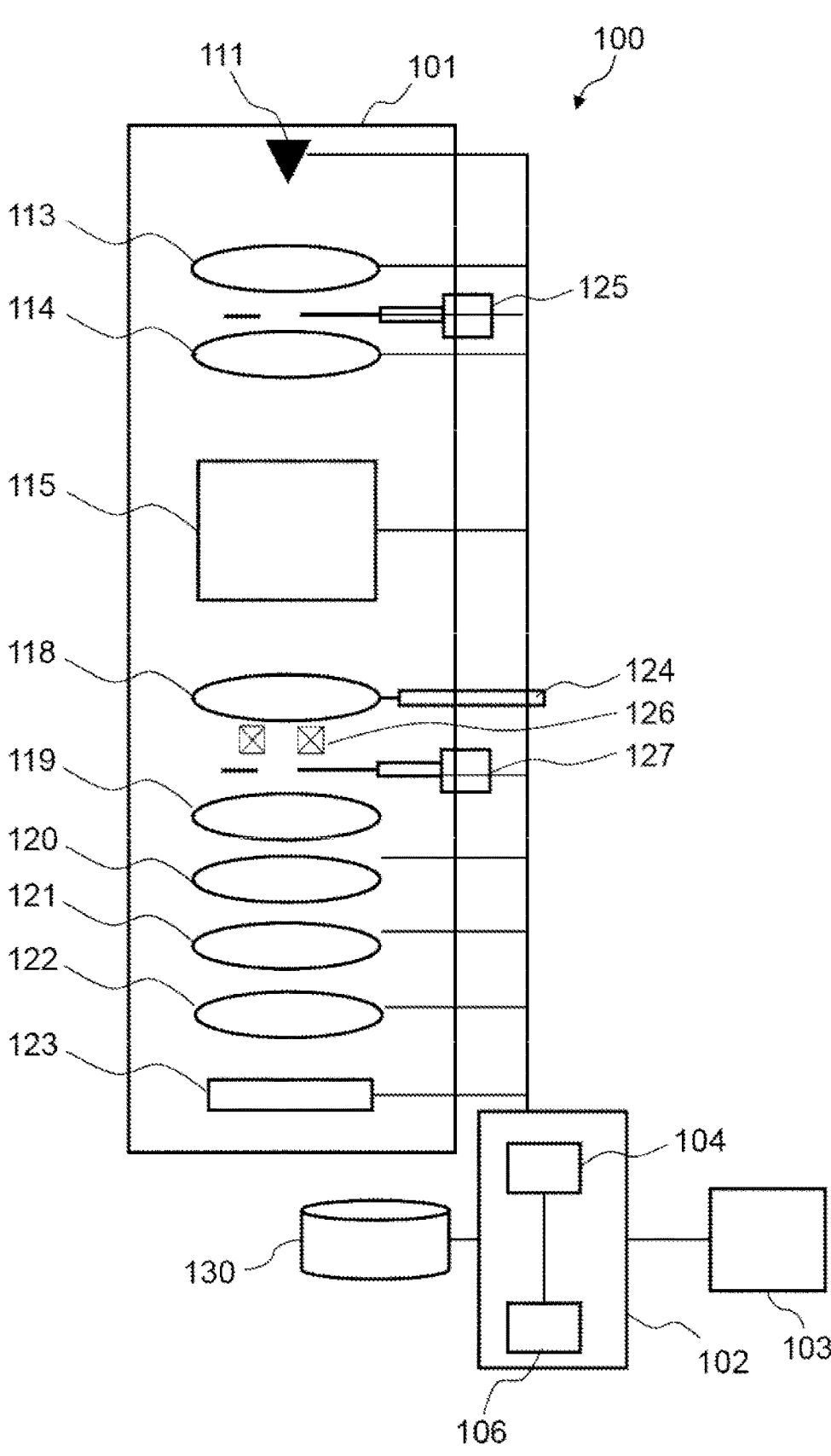
FIG. 1 is a diagram illustrating one example of a device configuration of a scanning transmission electron microscope 100 according to a first embodiment.

FIG. 1 is a diagram illustrating one example of a device configuration of a scanning transmission electron microscope 100 (STEM 100) according to a first embodiment of the invention. The STEM 100 includes a lens barrel 101 and a control unit 102.

The lens barrel 101 includes an electron source 111 for generating an electron beam, a first convergence lens 113, a second convergence lens 114, an aberration corrector 115, an objective lens 118, a sample stage 124, an illumination system aperture 125, a deflector 126, a selected area aperture 127, a first imaging lens 119, a second imaging lens 120, a third imaging lens 121, a fourth imaging lens 122, and an imaging camera 123. The control unit 102, an interface 103, and a storage unit 130 are connected to the lens barrel 101. A lens group including the objective lens 118 forms an electron optical system that emits an electron beam to a sample.

The control unit 102 includes a second adjustment lens current calculation device 104 and a second adjustment lens application device 106, and further includes an electron gun control circuit, an illumination lens control circuit, a condenser aperture control circuit, an aberration corrector control circuit, a deflector control circuit, an objective lens control circuit, and a camera control circuit all of which are not illustrated.

The control unit 102 acquires a value of a target device through the control circuit and creates a certain electron optical condition by inputting the value of the target device through the control circuit. The control unit 102 is one example of a control mechanism that implements a control of the lens barrel 101. The control unit 102 can be configured by a computer including a processor, a main storage device, an auxiliary storage device, an input device, and an output device.

The storage unit 130 is a storage device that stores data used for the control unit 102. For example, data described below with reference to FIG. 7 can be stored. The storage unit 130 can be configured as a storage device in the control unit 102 or can be disposed outside the control unit 102.

First Embodiment: Configuration of Aberration Corrector

Figure 2:
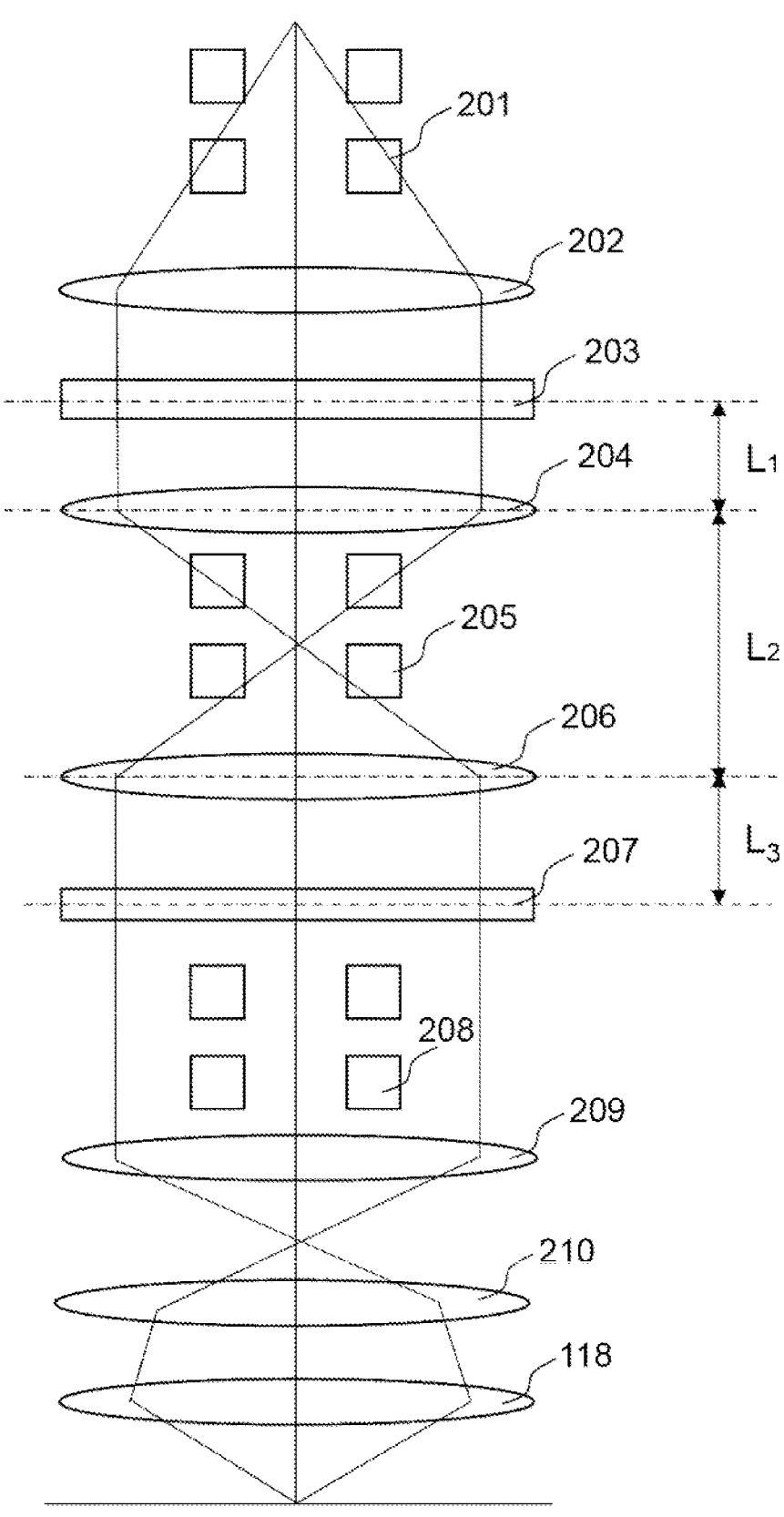
FIG. 2 is a diagram illustrating a configuration example of an aberration corrector 115.

FIG. 2 is a diagram illustrating a configuration example of the aberration corrector 115. The diagram illustrates an optical beam after passing through the second convergence lens. The aberration corrector 115 includes a first deflection coil 201, a first adjustment lens 202, a first multipole lens 203, a first transfer lens 204, a second deflection coil 205, a second multipole lens 207, a second transfer lens 206, a third deflection coil 208, a third transfer lens 209, and a second adjustment lens 210. For convenience of description, the objective lens 118 is also illustrated. The configuration of the aberration corrector 115 illustrated in FIG. 2 is merely exemplary, and the invention is not limited thereto. The aberration corrector 115 may include at least one transfer optical system and at least two multipoles.

In the aberration corrector 115, a distance L1 between the first multipole lens 203 and the first transfer lens 204 and a distance L3 between the second multipole lens 207 and the second transfer lens 206 are formed, and the distances L1 and L3 have the same lengths. A distance L2 between the first transfer lens 204 and the second transfer lens 206 is configured to be two times the distance L1. With such configuration, an imaging relationship of a magnification of 1-fold is established between the first multipole lens 203 and the second multipole lens 207. A charged particle beam is adjusted such that a trajectory thereof is parallel (the inclination is 0) to the first multipole lens 203, and the first multipole lens 203 and the second multipole lens 207 have the imaging relationship such that even in the second multipole lens 207, an inclination of a trajectory formed by the charged particle beam is 0 which is the same as in the first multipole lens 203. The aberration corrector 115 is configured by a round lens and a plurality of multipole lenses.

Figure 3:
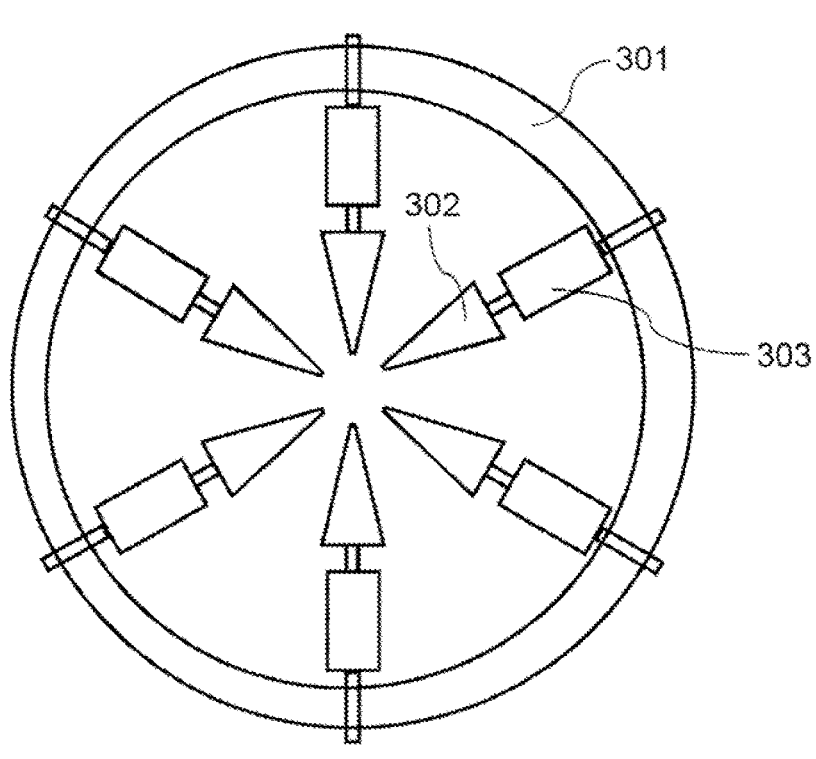
FIG. 3 is a plan view illustrating a configuration example of a first multipole lens 203 and a second multipole lens 207.
Figure 4:
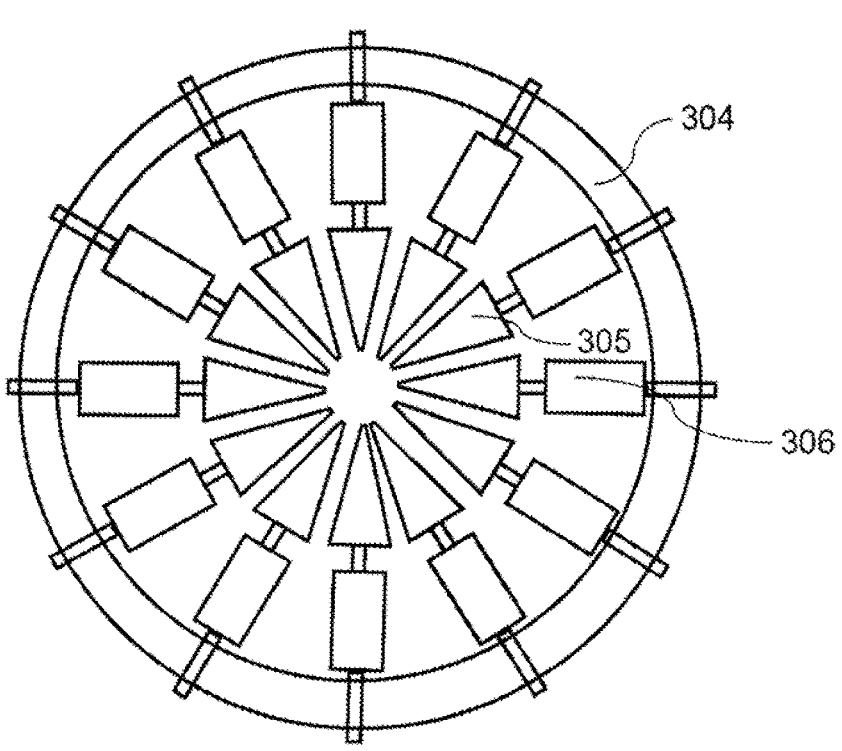
FIG. 4 is a plan view illustrating the configuration example of the first multipole lens 203 and the second multipole lens 207.

FIGS. 3 and 4 are plan views illustrating a configuration example of the first multipole lens 203 and the second multipole lens 207. As the multipole lens, for example, a lens such as a hexapole lens and a dodecapole lens for forming a magnetic field (hexapole field) with three-fold symmetry can be used. FIG. 3 illustrates one example of a configuration of the hexapole lens, and FIG. 4 illustrates one example of a structure of the dodecapole lens. A hexapole field generated by the first multipole lens 203 is reversed and is canceled out with a hexapole field generated by the second multipole lens 207. However, actually, there is a small rotational error between the two hexapole fields. To correct the rotational error, a hexapole field in any direction can be generated by adding two hexapole fields in the dodecapole lens.

The hexapole lens has a configuration where six magnetic poles 302 to which a coil 303 is attached are disposed relative to a ring-type magnetic path 301. The dodecapole lens has a configuration where twelve magnetic poles 305 to which a coil 306 is attached are disposed relative to a ring-type magnetic path 304. When a current flows through the coil 306, a magnetic field is generated. By combining the magnetic fields of the magnetic poles 305, a hexapole field is formed in a center region of the multipole. The control unit 102 controls the charged particle beam to pass through the hexapole field formed in the center region of the multipole.

First Embodiment: Aberration Correction Method

Figure 5A:
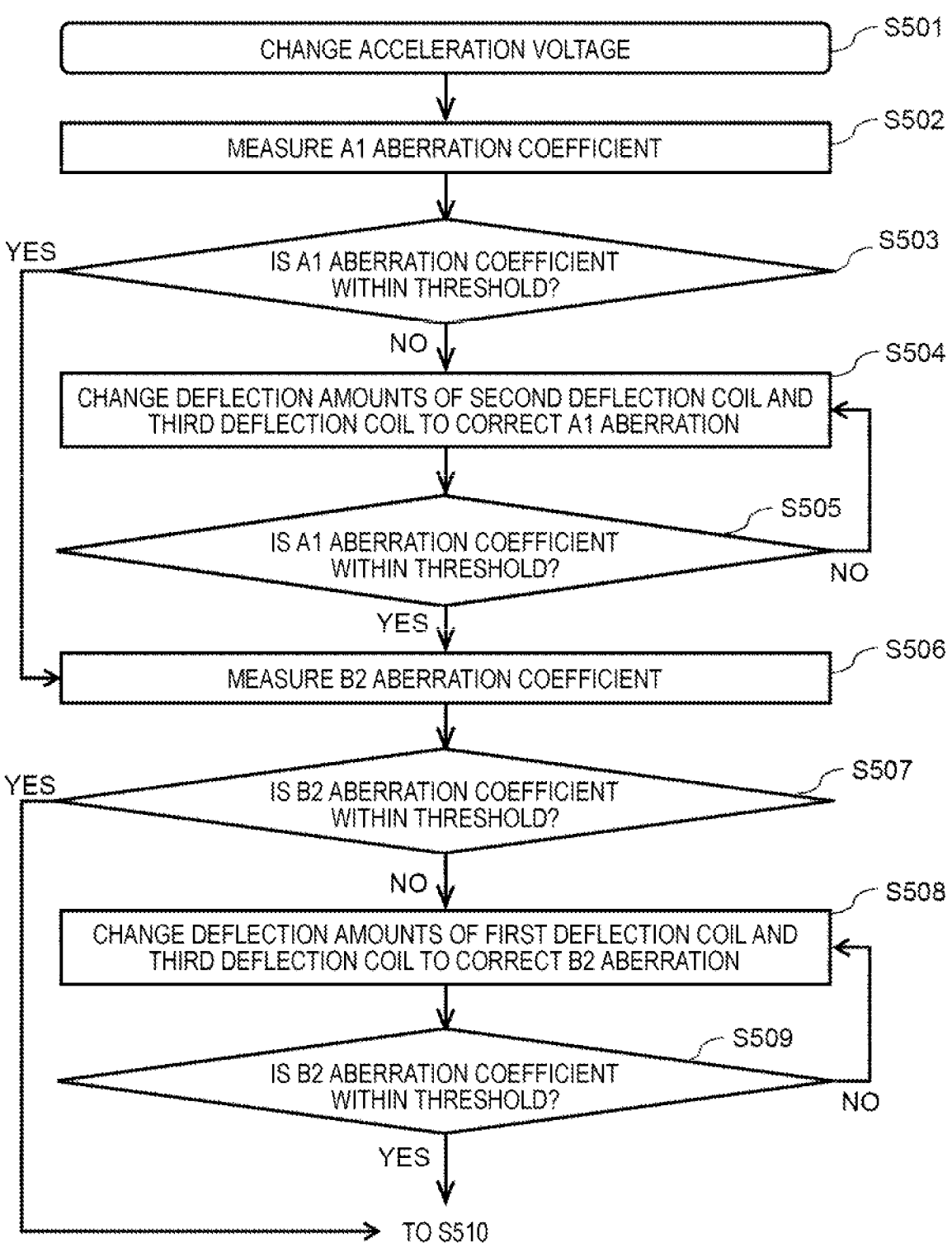
FIG. 5A illustrates one example of an aberration correction procedure as a comparative example.
Figure 5B:
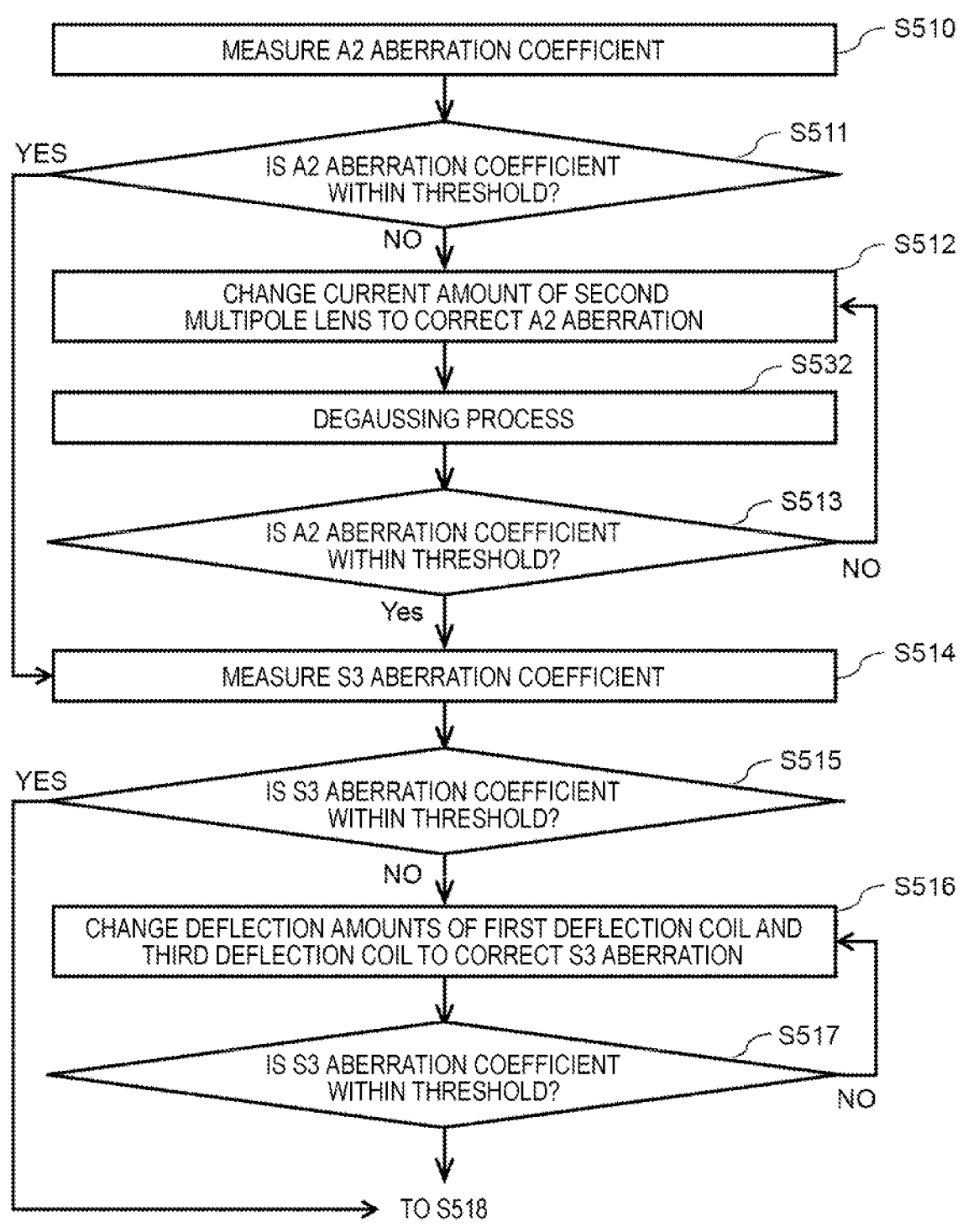
FIG. 5B illustrates the example of the aberration correction procedure as the comparative example.
Figure 5C:
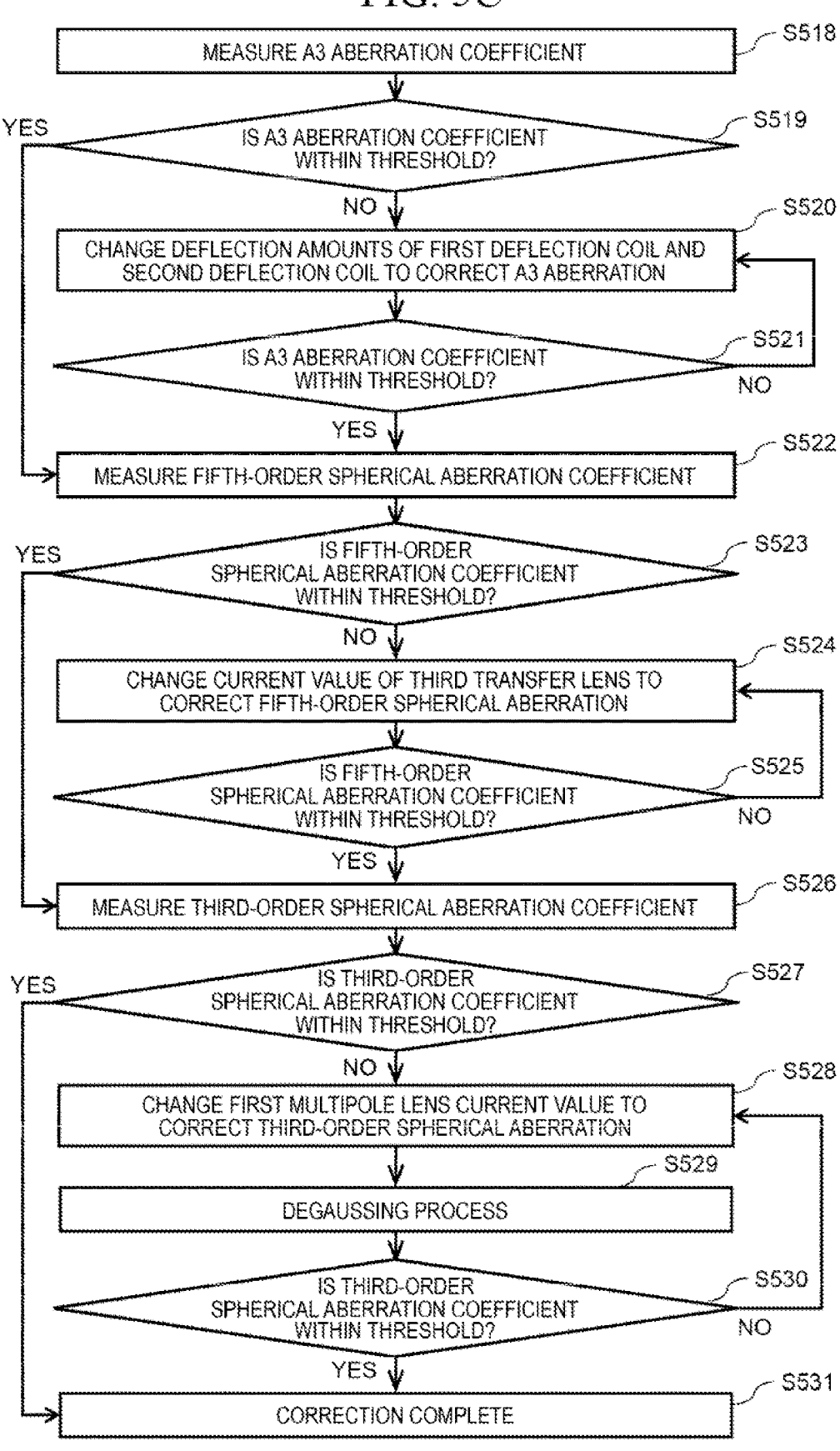
FIG. 5C illustrates the example of the aberration correction procedure as the comparative example.

FIGS. 5A to 5C illustrate one example of an aberration correction procedure as a comparative example. The following procedure is an example where the adjustment of aberration correction at an acceleration voltage of 200 kV is completed and subsequently aberration correction at 80 kV is executed. The flowchart is executed by the control unit 102. The value of the acceleration voltage is not limited hereto, but it is desirable that, after initially correcting aberration at a high acceleration voltage, the flowchart is executed at a low acceleration voltage.

Each of aberrations described below will be described. A1 aberration is astigmatism of first-order two-fold symmetry, A2 aberration is astigmatism of second-order three-fold symmetry, and A3 aberration is astigmatism of third-order four-fold symmetry. B2 aberration is coma aberration of second-order one-fold symmetry, and S3 aberration is star aberration of third-order two-fold symmetry.

In S501, the acceleration voltage is changed from 200 kV to 80 kV, and the aberration correction starts. In S502, an A1 aberration coefficient as low-order aberration is measured. In S503, whether the A1 aberration coefficient is within a threshold is determined.

As a determination method, for example, a plurality of Ronchigrams are acquired first, and the Ronchigrams are divided into respective segments. Each of the segments includes information regarding aberration at the time of incidence. When a two-dimensional Gaussian distribution is assumed as an intensity distribution of a light source, the intensity of a cross correlation function of the segment is proportional to the two-dimensional Gaussian distribution. By fitting a contour line of the cross correlation function of the segment using an elliptic equation, the solution of the equation including the information regarding the aberration in each of the segments is acquired. By measuring the aberration coefficient using the above-described method and comparing the measured aberration coefficient to a preset aberration coefficient, it is determined whether the aberration coefficient is within the threshold.

In S503, when the A1 aberration coefficient is within the threshold, the process is skipped to S506. When the A1 aberration coefficient is not within the threshold, the process proceeds to S504, and the A1 aberration is changed. A control method of the A1 aberration is, for example, as follows. An electron beam incident on the second multipole lens 207 is shifted parallel to the optical axis by the second deflection coil 205, and is shifted back to the optical axis by the third deflection coil 208. As a result, the A1 aberration can be changed.

In S505, the A1 aberration coefficient is measured, and it is determined whether the A1 aberration coefficient is within the threshold. When the A1 aberration coefficient is within the threshold, the process proceeds to S506. When the A1 aberration coefficient is not within the threshold, the process returns to S504. The process is repeated until the A1 aberration coefficient is within the threshold.

In S506, a B2 aberration coefficient is measured. In S507, it is determined whether the B2 aberration coefficient is within a threshold. When the B2 aberration coefficient is within the threshold, the process is skipped to S510. When the B2 aberration coefficient is not within the threshold, the process proceeds to S508, and the B2 aberration is changed. A control method of the B2 aberration is, for example, as follows. An electron beam incident on the first multipole lens 203 is shifted parallel to the optical axis by the first deflection coil 201, and is shifted back to the optical axis by the third deflection coil 208. As a result, the B2 aberration can be changed.

In S509, the B2 aberration coefficient is measured, and it is determined whether the B2 aberration coefficient is within the threshold. When the B2 aberration coefficient is within the threshold, the process proceeds to S510. When the B2 aberration coefficient is not within the threshold, the process returns to S508. The process is repeated until the B2 aberration coefficient is within the threshold.

In S510, an A2 aberration coefficient is measured. In S511, it is determined whether the A2 aberration coefficient is within a threshold. When the A2 aberration coefficient is within the threshold, the process is skipped to S514. When the A2 aberration coefficient is not within the threshold, the process proceeds to S512, and the A2 aberration is corrected by changing a current value of the second multipole lens 207 and changing the intensity of the generated hexapole field. When the current value of the multipole lens is changed, the effect of hysteresis is large. Therefore, in S532, it is desirable to execute a degaussing process. About 20 seconds is required for the degaussing process to completely remove the effect of hysteresis, and thus whenever S532 is executed, an appropriate period of time is required.

In S513, the A2 aberration coefficient is measured, and it is determined whether the A2 aberration coefficient is within the threshold. When the A2 aberration coefficient is within the threshold, the process proceeds to S514. When the A2 aberration coefficient is not within the threshold, the process returns to S512. The process is repeated until the A2 aberration coefficient is within the threshold.

In S514, an S3 aberration coefficient is measured. In S515, it is determined whether the S3 aberration coefficient is within a threshold. When the S3 aberration coefficient is within the threshold, the process is skipped to S518. When the S3 aberration coefficient is not within the threshold, the process proceeds to S516, and the S3 aberration is changed. A control method of the S3 aberration is, for example, as follows. An electron beam incident on the first multipole lens 203 is tilted (inclined) with respect to the optical axis by the first deflection coil 201, and is tilted back to the optical axis by the third deflection coil 208. As a result, the S3 aberration can be changed.

In S517, the S3 aberration coefficient is measured, and it is determined whether the S3 aberration coefficient is within the threshold. When the S3 aberration coefficient is within the threshold, the process proceeds to S518. When the S3 aberration coefficient is not within the threshold, the process returns to S516. The process is repeated until the S3 aberration coefficient is within the threshold.

In S518, an A3 aberration coefficient is measured. In S519, it is determined whether the A3 aberration coefficient is within a threshold. When the A3 aberration coefficient is within the threshold, the process is skipped to S522. When the A3 aberration coefficient is not within the threshold, the process proceeds to S520, and the A3 aberration is changed. A control method of the A3 aberration is, for example, as follows. An electron beam incident on the first multipole lens 203 is tilted with respect to the optical axis by the first deflection coil 201, and is tilted back to the optical axis by the second deflection coil 205. As a result, the A3 aberration can be changed.

In S521, the A3 aberration coefficient is measured, and it is determined whether the A3 aberration coefficient is within the threshold. When the A3 aberration coefficient is within the threshold, the process proceeds to S522. When the A3 aberration coefficient is not within the threshold, the process returns to S520. The process is repeated until the A3 aberration coefficient is within the threshold.

In S522, a fifth-order spherical aberration coefficient is measured. In S523, it is determined whether the fifth-order spherical aberration coefficient is within a threshold. When the fifth-order spherical aberration coefficient is within the threshold, the process is skipped to S526. When the fifth-order spherical aberration coefficient is not within the threshold, the process proceeds to S524, and the fifth-order spherical aberration is corrected by changing the current value of the third transfer lens.

In S525, it is determined whether the fifth-order spherical aberration coefficient is within the threshold. When the fifth-order spherical aberration coefficient is within the threshold, the process proceeds to S526. When the fifth-order spherical aberration coefficient is not within the threshold, the process returns to S524. The process is repeated until the fifth-order spherical aberration coefficient is within the threshold.

In S526, a third-order spherical aberration coefficient is measured. In S527, it is determined whether the third-order spherical aberration coefficient is within the threshold. When the third-order spherical aberration coefficient is within the threshold, the process is skipped to S531. When the third-order spherical aberration coefficient is not within the threshold, the process proceeds to S528, and the third-order spherical aberration is corrected by changing the current value of the first multipole lens 203. When the current value of the multipole lens is changed, the effect of hysteresis is large. Therefore, in S529, it is desirable to execute a degaussing process. About 20 seconds is required for the degaussing process to completely remove the effect of hysteresis, and thus whenever S529 is executed, an appropriate period of time is required.

In S530, it is determined whether the third-order spherical aberration coefficient is within the threshold. When the third-order spherical aberration coefficient is within the threshold, the process proceeds to S531. When the third-order spherical aberration coefficient is not within the threshold, the process returns to S528. The process is repeated until the third-order spherical aberration coefficient is within the threshold. As a result, the aberration correction process is completed (S531).

Figure 6:
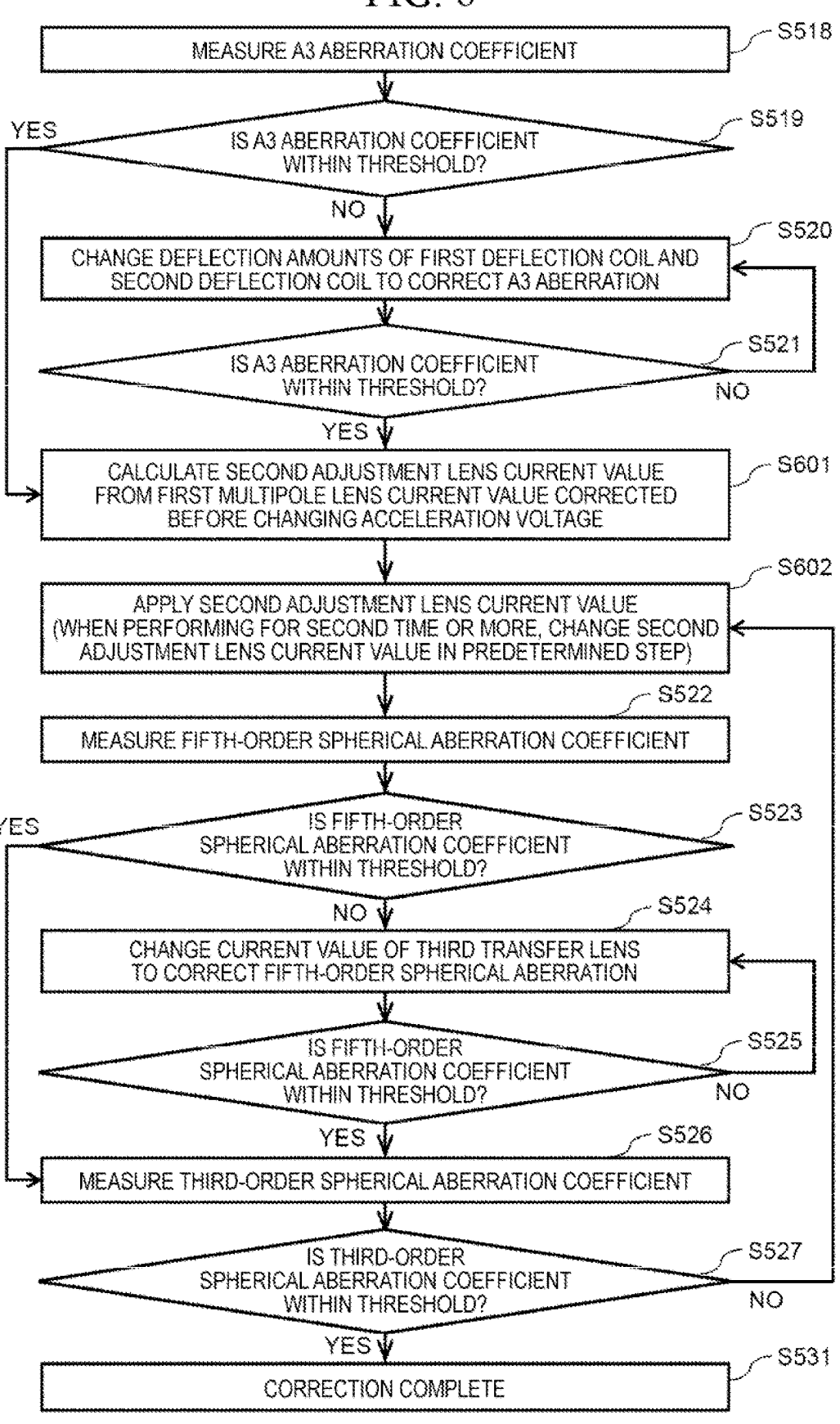
FIG. 6 illustrates one example of an aberration correction procedure according to the first embodiment.

FIG. 6 illustrates one example of an aberration correction procedure according to the first embodiment. Since S501 to S521 are the same as those of FIGS. 5A to 5C, the description will not be made. For convenience of description, FIG. 6 illustrates only steps after S518 (that is, portions corresponding to FIG. 5C). Hereinafter, the steps different from those of FIG. 5C will be mainly described.

Figure 7:
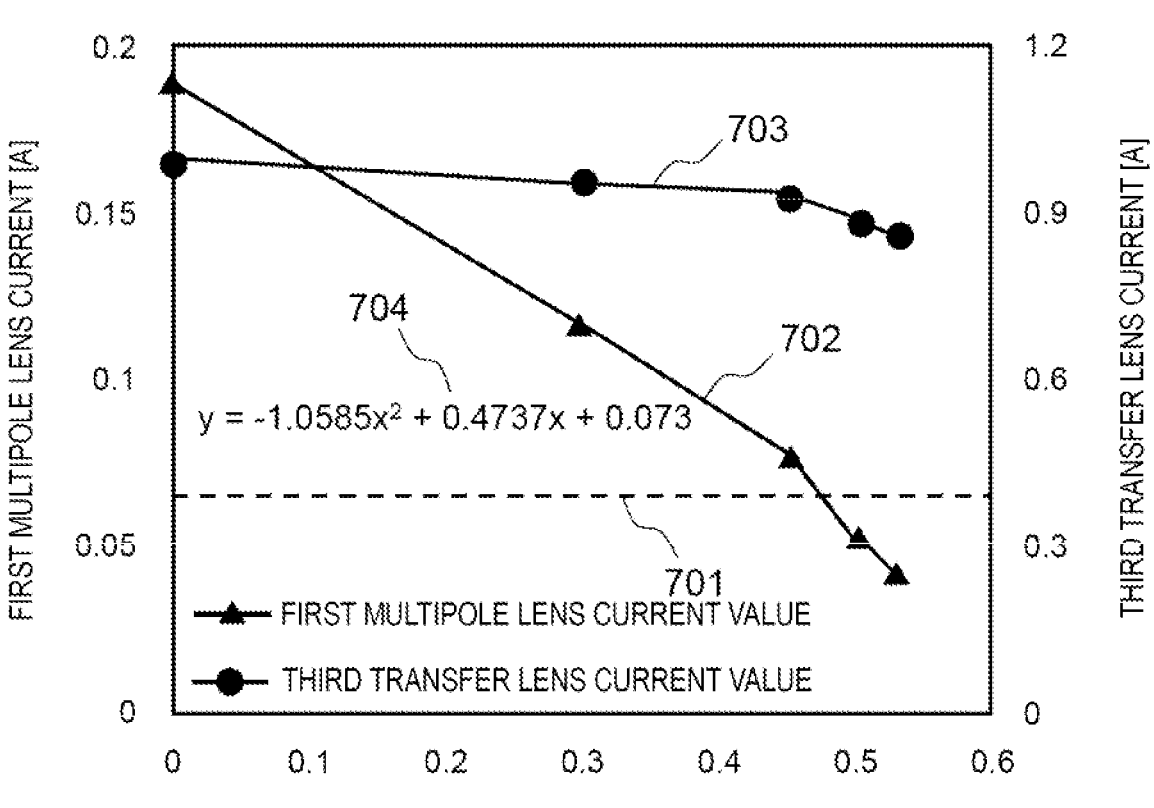
FIG. 7 illustrates a relationship between a second adjustment lens current and a first multipole lens current at an acceleration voltage of 80 kV, the relationship being obtained by actual machine evaluation.

S601 and S602 are newly added between S521 and S522. In S601, a current value of the second adjustment lens 210 is calculated from a current value of the first multipole lens 203 that is corrected before changing the acceleration voltage (in the example, 200 kV). A relationship between the lens current value of the first multipole lens 203 and the lens current value of the second adjustment lens 210 can be specified in advance as illustrated in FIG. 7 below. Based on the relationship, the second adjustment lens current value can be calculated from the first multipole lens current value. The second adjustment lens current value in the step has a function as an initial value.

In S602, the calculated current value is applied to the second adjustment lens 210. When performing the step for second time or more, the second adjustment lens current value is scanned by changing the previous second adjustment lens current value at predetermined step intervals.

As described below with reference to FIG. 7, the initial value of the second adjustment lens current is set such that the third-order spherical aberration can be corrected. To further correct the fifth-order spherical aberration at the set second adjustment lens current, S523 to S525 are executed. The steps are the same as those of FIG. 5C.

In S526, a third-order spherical aberration coefficient is measured. In S527, it is determined whether the third-order spherical aberration coefficient is within the threshold. When the third-order spherical aberration coefficient is within the threshold, the process is skipped to S531. When the third-order spherical aberration coefficient is not within the threshold, the process returns to S602, and S522 to S524 is executed at the new second adjustment lens current value.

The initial value of the second adjustment lens current set in S602 is set such that the third-order spherical aberration can be corrected. Note that, since the fifth-order spherical aberration is corrected next in S522 to S524, new third-order spherical aberration may be generated due to the effect. Accordingly, in S526 and S527, whether the third-order spherical aberration is maintained within the threshold is checked.

In other words, in the flowchart of FIG. 6, the fifth-order spherical aberration is further repeatedly corrected by adjusting a third transfer lens current while adjusting the second adjustment lens current to adjust the third-order spherical aberration. As a result, the third-order spherical aberration and the fifth-order spherical aberration are corrected by the two lenses. As a result, the aberrations can be corrected without changing the first multipole lens current. Therefore, S528 to S530 can be skipped. That is, the degaussing process accompanied by the change of the first multipole lens current can be skipped.

In S601, a process of calculating the second adjustment lens current is executed by the second adjustment lens current calculation device 104. When the acceleration voltage is changed, the second adjustment lens current calculation device 104 calculates the second adjustment lens current value from a relationship (the description below with reference to FIG. 7) between the first multipole lens current value and the second adjustment lens current value. When performing S602 for the second time or more, the second adjustment lens current calculation device 104 changes the second adjustment lens current value in a predetermined step. For example, a method of changing the current value such that the current value is comprehensively searched for in a predetermined range around the initial value can be considered. The current value may be changed using other appropriate methods.

There is an optimum beam crossing position for correcting the fifth-order spherical aberration. When the crossing position is focused by only the third transfer lens 209, a coupling magnification of the aberration corrector 115 and the objective lens 118 is constant. Therefore, when spherical aberration of the objective lens 118 is changed by changing the acceleration voltage, an excitation condition of the multipole lens for correcting the spherical aberration changes. By using the second adjustment lens 210 in combination, the coupling magnification of the aberration corrector 115 and the objective lens 118 can be changed while maintaining the crossing position at which the fifth-order spherical aberration is corrected, and the amounts of excitation of the first multipole lens 203 and the second multipole lens 207 can be made constant regardless of the acceleration voltage. As a result, it is considered that the third-order spherical aberration and the fifth-order spherical aberration can be corrected without changing the multipole lens current.

FIG. 7 illustrates a relationship between the second adjustment lens current and the first multipole lens current at an acceleration voltage of 80 kV, the relationship being obtained by actual machine evaluation. The corresponding third transfer lens current value is also illustrated.

A dotted line 701 represents the first multipole lens current value at which aberration can be corrected at an acceleration voltage of 200 kV, the first multipole lens current value being obtained by actual machine evaluation. Here, the first multipole lens current value is, for example, 0.06 A. While the first multipole lens current value is fixed, the acceleration voltage is changed to 80 kV, and the flowchart of FIG. 6 starts.

A solid line 702 represents a relationship between the first multipole lens current value and the second adjustment lens current value where the third-order spherical aberration can be corrected at an acceleration voltage of 80 kV, the relationship being obtained by actual machine evaluation. A mathematical expression 704 is an approximate mathematical expression of the solid line 702. In S601, the initial value of the second adjustment lens current value is calculated based on the mathematical expression 704 from the first multipole lens current value before changing the acceleration voltage.

A solid line 703 represents a relationship between the third transfer lens current value and the second adjustment lens current value where the fifth-order spherical aberration can be corrected at an acceleration voltage of 80 kV, the relationship being obtained by actual machine evaluation. The third transfer lens current value shows the actual machine evaluation result of the current value adjusted in S524 and S525.

First Embodiment: Summary

The scanning transmission electron microscope 100 according to the first embodiment includes the aberration corrector 115 that includes the first multipole lens 203, the second multipole lens 207, the third transfer lens 209, and the second adjustment lens 210, in which the first multipole lens 203 is configured to correct third-order spherical aberration by adjusting a lens current, and third-order spherical aberration and fifth-order spherical aberration are collectively corrected by adjusting the third transfer lens current while changing the second adjustment lens current. As a result, the third-order spherical aberration and the fifth-order spherical aberration can be corrected without changing, at a low acceleration voltage (for example, 80 kV), the first multipole lens current that is adjusted such that the aberration correction can be executed at a high acceleration voltage (for example 200 kV). Accordingly, the degaussing process accompanied by the change of the first multipole lens current can be skipped.

Second Embodiment

Figure 8:
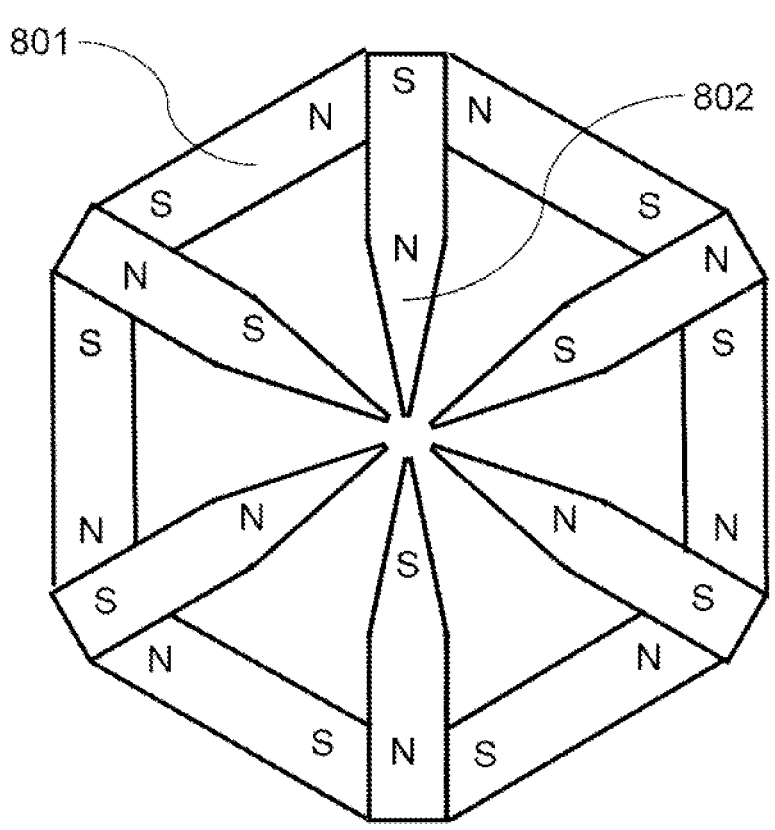
FIG. 8 illustrates one example of a hexapole lens configured by a permanent magnet.

FIG. 8 illustrates one example of a hexapole lens configured by a permanent magnet. Using the method described in the first embodiment, the aberration can be corrected without changing the amount of excitation of the multipole lens regardless of the acceleration voltage. Accordingly, the coils configuring the first multipole lens 203 and the second multipole lens 207 can be replaced with a permanent magnet. Here, the multipole lens is mainly configured by a permanent magnet 801 and a pole 802. The pole 802 may be a permanent magnet or may be a magnetic body such as pure iron, Permalloy, or Permendur. The second embodiment is the same as the first embodiment except for the configuration of the multipole lens.

When both of the first multipole lens 203 and the second multipole lens 207 are replaced with a permanent magnet, to completely cancel out A2 aberration generated from the two lenses, it is necessary to finely rotate a hexapole field generated by the first multipole lens 203. By finely adjusting an excitation condition of the first transfer lens 204 or the second transfer lens 206, or by providing an additional round lens between the first multipole lens 203 and the second multipole lens 207, a hexapole field generated by the first multipole lens 203 can be rotated.

For example, a deflection field, that is generated by a deviation in pole or a variation in magnetic field characteristics of a material when a hexapole field is generated by a permanent magnet, may be adjusted by alignment using the first deflection coil 201, the second deflection coil 205, and the third deflection coil 208, or may be adjusted by providing an additional deflection coil. For example, a quadrupole field (A1) that is generated by a deviation in pole or a variation in magnetic field characteristics of a material can be corrected when an electron beam incident on the second multipole lens 207 is shifted parallel to the optical axis by the second deflection coil 205 and is shifted back to the optical axis by the third deflection coil 208.

Only any one of the first multipole lens 203 or the second multipole lens 207 may be replaced with a multipole lens configured by only a permanent magnet. For example, the first multipole lens 203 may be configured by a permanent magnet, and the second multipole lens 207 may be configured as a dodecapole lens using a coil.

Second Embodiment: Summary

In the scanning transmission electron microscope 100 according to the second embodiment, at least one of the first multipole lens 203 or the second multipole lens 207 generates as lens magnetic field using only the permanent magnet. By using the multipole lens configured by the permanent magnet, a power supply for which high stability is required can be made unnecessary.

Regarding Modification Example of Invention

The invention is not limited to the embodiments described above and includes various modification examples. For example, the embodiments have been described in detail to easily describe the disclosure, and the invention is not necessarily to include all the configurations described above. A part of the configuration of one embodiment can be replaced with the configuration of another embodiment. The configuration of one embodiment can be added to the configuration of another embodiment. Addition, deletion, and replacement of another configuration can be made for a part of the configuration each of the embodiments.

In the specification and the like, the expression "first", "second", "third", or the like is added to distinguish between components, and does not always limit the number or order thereof. For easy understanding of the invention, position, size, shape, range, and the like of each of the components illustrated in the drawings do not necessarily represent the actual ones. Accordingly, the invention is not necessarily limited to the position, size, shape, range, and the like illustrated in the drawings.

In the above embodiments, the STEM 100 was described as an example of the electron microscope to which the invention is applicable. However, the invention is also applicable to other types of electron microscopes.

REFERENCE SIGNS LIST

| | |
|---|---|
| 100: | scanning transmission electron microscope |
| 102: | control unit |
| 115: | aberration corrector |
| 118: | objective lens |
| 201: | first deflection coil |
| 202: | first adjustment lens |
| 203: | first multipole lens |
| 204: | first transfer lens |
| 205: | second deflection coil |
| 206: | second transfer lens |
| 207: | second multipole lens |
| 208: | third deflection coil |
| 209: | third transfer lens |
| 210: | second adjustment lens |

The invention claimed is:

1. An electron microscope that observes a sample using an electron beam, the electron microscope comprising:

an electron optical system including an objective lens configured to scan by the electron beam;

an aberration corrector configured to correct an aberration of a lens of the electron optical system; and a control unit configured to control the aberration corrector, wherein the aberration corrector includes first and second multipole lenses configured to generate a magnetic field for correcting a spherical aberration of the lens, a transfer lens configured to cause the electron beam to propagate to the objective lens, and an adjustment lens disposed between the transfer lens and the objective lens, the transfer lens is configured to correct fifth-order spherical aberration using a transfer lens current applied to the transfer lens, the first multipole lens is configured to correct third-order spherical aberration using a multipole lens current applied to the first multipole lens, and the control unit corrects the third-order spherical aberration by adjusting the transfer lens current to correct the fifth-order spherical aberration while changing an adjustment lens current applied to the adjustment lens.

2. The electron microscope according to claim 1, wherein the control unit corrects the third-order spherical aberration by adjusting the transfer lens current to correct the fifth-order spherical aberration without adjusting the multipole lens current.

3. The electron microscope according to claim 1, wherein the control unit corrects the fifth-order spherical aberration by changing the transfer lens current until the fifth-order spherical aberration is equal to or less than a threshold at the adjustment lens current, and when the third-order spherical aberration is not within a threshold at the transfer lens current after correcting the fifth-order spherical aberration, the control unit redetermines the adjustment lens current by changing the adjustment lens current and changes the transfer lens current until the fifth-order spherical aberration is equal to or less than a threshold at the redetermined adjustment lens current.

4. The electron microscope according to claim 3, wherein the control unit determines the adjustment lens current based on a correlation between the multipole lens current and the adjustment lens current, and the control unit corrects the fifth-order spherical aberration by changing the transfer lens current until the fifth-order spherical aberration is equal to or less than a threshold at the determined adjustment lens current.

5. The electron microscope according to claim 4, wherein the electron microscope further includes a storage unit configured to store data describing the correlation, the correlation describes a relationship between the multipole lens current and the adjustment lens current where the third-order spherical aberration is correctable, and the control unit corrects the fifth-order spherical aberration at the adjustment lens current where the third-order spherical aberration is correctable by determining the adjustment lens current based on the correlation.

6. The electron microscope according to claim 1, wherein the control unit corrects each of the aberrations at a first acceleration voltage, and the control unit corrects the fifth-order spherical aberration and the third-order spherical aberration at a second acceleration voltage different from the first acceleration voltage without readjusting the multipole lens current that is adjusted to correct each of the aberrations at the first acceleration voltage.

7. The electron microscope according to claim 6, wherein the second acceleration voltage is lower than the first acceleration voltage.

8. The electron microscope according to claim 6, further comprising:

a storage unit configured to store data describing a correlation between the multipole lens current and the adjustment lens current, wherein the correlation describes a relationship between the multipole lens current and the adjustment lens current where the third-order spherical aberration is correctable, and the control unit corrects the fifth-order spherical aberration at the adjustment lens current where the third-order spherical aberration is correctable without readjusting the multipole lens current by determining the adjustment lens current corresponding to the multipole lens current that is adjusted to correct each of the aberrations at the first acceleration voltage based on the correlation.

9. The electron microscope according to claim 1, wherein the first multipole lens and the second multipole lens are configured as a magnetic lens that focuses the electron beam using a magnetic field, and at least one of the first multipole lens or the second multipole lens generates the magnetic field using only a permanent magnet.

10. The electron microscope according to claim 1, wherein the first and second multipole lenses are electromagnetic lenses configured to generate a hexapole field.

* * * * *